(12) United States Patent
Tseng et al.

(10) Patent No.: US 9,410,995 B2
(45) Date of Patent: Aug. 9, 2016

(54) MEASUREMENT DEVICES AND MEASUREMENT METHODS FOR POWER CONSUMPTION

(71) Applicant: Accton Technology Corporation, Hsinchu (TW)

(72) Inventors: Min-Chun Tseng, Hsinchu (TW); Shih-An Yu, Hsinchu (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 763 days.

(21) Appl. No.: 13/862,739

(22) Filed: Apr. 15, 2013

(65) Prior Publication Data

US 2013/0275064 A1   Oct. 17, 2013

(30) Foreign Application Priority Data

Apr. 16, 2012   (TW) .............................. 101113422 A

(51) Int. Cl.
*G01R 21/06* (2006.01)
*G01R 21/14* (2006.01)
*G01R 21/02* (2006.01)
*G01R 21/133* (2006.01)

(52) U.S. Cl.
CPC ................ *G01R 21/02* (2013.01); *G01R 21/06* (2013.01); *G01R 21/14* (2013.01); *G01R 21/133* (2013.01)

(58) Field of Classification Search
CPC combination set(s) only.
See application file for complete search history.

(56) References Cited

U.S. PATENT DOCUMENTS

| 6,411,119 | B1 * | 6/2002 | Feldtkeller | 324/750.3 |
| 7,177,727 | B2 * | 2/2007 | Chu et al. | 700/287 |
| 7,898,225 | B2 * | 3/2011 | Tsai et al. | 323/222 |
| 8,351,232 | B2 * | 1/2013 | Zhang | 363/89 |

FOREIGN PATENT DOCUMENTS

| EP | 2 339 726 A1 | 12/2010 |
| TW | 200637100 A | 10/2006 |
| TW | 200915120 A | 4/2009 |
| TW | M385003 U1 | 7/2010 |

* cited by examiner

*Primary Examiner* — Huan Tran
(74) *Attorney, Agent, or Firm* — Birch, Stewart, Kolasch & Birch, LLP

(57) ABSTRACT

A measurement device is provided. The measurement device comprises a power controller, a detector, a temperature sensor, and a processor. The power controller receives alternating-current (AC) power and transforms the AC power to direct-current (DC) power. The detector detects the DC power to generate a voltage value and a current value. The temperature sensor senses an environment temperature of the measurement device. The processor reads the voltage value, the current value, and the environment temperature and obtains an efficiency coefficient of the power controller according to the voltage value, the current value, and the environment temperature. The processor further obtains a real power consumption value corresponding to the AC power according to the efficiency coefficient.

11 Claims, 6 Drawing Sheets

MEASUREMENT DEVICES AND MEASUREMENT METHODS FOR POWER CONSUMPTION

CROSS REFERENCE TO RELATED APPLICATIONS

This application claims the benefit of Taiwan application Serial No. 101113422 filed Apr. 16, 2012, the subject matter of which is incorporated herein by reference.

BACKGROUND OF THE INVENTION

1. Field of the Invention

The invention relates to a measurement device and method, and more particularly to a measurement device and method for power consumption.

2. Description of the Related Art

FIG. 1 shows a conventional electronic apparatus with power consumption measurement. Referring to FIG. 1, the electric apparatus 1 comprises a power consumption monitoring module 10, a power module 11, an isolation and protection unit 12, a processing unit 13, and a temperature sensor 14. The power consumption monitor module 10 detects external alternating-current (AC) power VAC to obtain power consumption of the electric apparatus 1 to the external AC VAC power by and generate a corresponding monitoring signal S10 to the processing unit 13. Moreover, the power module 11 also receives the external AC power VAC and performs an AC-DC transformation operation and a buck conversion to the AC power VAC to generate direct-current (DC) power VDC, such as AC power of 12V. The DC power is provided to a system circuit board 15, so that the elements on the system circuit board 15 operate according to the operation voltages of the elements.

As per the above description, the power consumption monitor module 10 is disposed on the high-voltage side, and the processing unit 13 which receives the monitoring signal S10 from the power consumption monitor module 10 is disposed on the low-voltage side. The power consumption measured on the high-voltage side of the electronic apparatus can be used to obtain a relatively accurate value of the power consumption. In order to avoid damage to the processing unit 13 when an electric shock or abnormal condition occurs on the high-voltage side, the isolation and protection unit 12 is additionally disposed between the power consumption monitor module 10 and the processing unit 13, which increases the entire size of the electronic apparatus 1. Moreover, since high-voltage elements are used for the electronic apparatus 1, the electronic apparatus 1 has higher-capacity space, which increases the entire size and manufacturing cost of the electronic apparatus 1.

BRIEF SUMMARY OF THE INVENTION

An exemplary embodiment of a measurement device is provided. The measurement device comprises a power controller, a detector, a temperature sensor, and a processor. The power controller receives alternating-current (AC) power and transforms the AC power to direct-current (DC) power. The detector detects the DC power to generate a voltage value and a current value. The temperature sensor senses an environment temperature of the measurement device. The processor reads the voltage value, the current value, and the environment temperature and obtains an efficiency coefficient of the power controller according to the voltage value, the current value, and the environment temperature. The processor further obtains a real power consumption value corresponding to the AC power according to the efficiency coefficient.

One exemplary embodiment of a measurement method is provided. The measurement method is performed to measure a power consumption value of an electronic apparatus. The electronic apparatus is powered by direct-current (DC) power transformed from alternating-current (AC) power. The measurement method comprises detecting the DC power to generate a voltage value and a current value; sensing an environment temperature; obtaining an efficiency coefficient according to the voltage value, the current value, and the environment temperature; and obtaining a real power consumption value to the AC power according to the efficiency coefficient.

Another exemplary embodiment of a measurement method is provided. The measurement method comprises providing alternating-current (AC) power; transforming the AC power to direct-current (DC) power; detecting the DC power to generate a voltage value and a current value; sensing an environment temperature; and calculating an estimated power consumption value according to the voltage value and the current value.

The measurement method also comprises performing a search operation to a database according to the estimated power consumption value and the environment temperature. The database stores a plurality of reference power consumption values, a plurality of reference environment temperatures, and a plurality of reference efficiency coefficients, and one of the reference power consumption values and one of the reference environment temperatures collectively correspond to one of the reference efficiency coefficients.

The measurement method further comprises determining that the estimated power consumption value is between a first reference power consumption value and a second reference power consumption value among the plurality of reference power consumption values according to the search operation to the database. The second reference power consumption value is larger than the first reference power consumption value.

The measurement method comprises determining that the environment temperature is between a first reference environment temperature and a second reference environment temperature among the plurality of reference environment temperatures according to the search operation to the database. The first reference environment temperature is higher than the second reference environment temperature.

The measurement method also comprises performing the search operation to the database to find the reference efficiency coefficient corresponding to the first reference power consumption value and the first reference environment temperature to serve as a first estimated efficiency coefficient and find the reference efficiency coefficient corresponding to the second reference power consumption value and the first reference environment temperature to serve as a second estimated efficiency coefficient and also performing the search operation to the database to find the reference efficiency coefficient corresponding to the first reference power consumption value and the second reference environment temperature to serve as a third estimated efficiency coefficient and find the reference efficiency coefficient corresponding to the second reference power consumption value and the second reference environment temperature to serve as a fourth estimated efficiency coefficient.

The measurement method further comprises calculating a first intermediate value efficiency and a second intermediate value efficiency according to $\rho = \rho 1 + (\rho 2 - \rho 1) \times (P - Pf1)$. P represents the estimated power consumption value, Pf1 represents the first reference power consumption value, ρ1 represents the first estimated efficiency coefficient and ρ2 represents the second estimated efficiency coefficient when the processor calculates the first intermediate value, and ρ1 represents the third estimated efficiency coefficient and ρ2 represents the fourth estimated efficiency coefficient when the processor calculates the second intermediate value efficiency.

Also, the measurement method comprises calculating an efficiency coefficient according to ρreal=(ρtf1+ρtf2)×(Tf1−T)/(Tf1−Tf2). ρreal represents the efficiency coefficient, ρtf1 represents the first intermediate value efficiency, ρtf2 represents the second intermediate value efficiency, Tf1 represents the first reference environment temperature, Tf2 represents the second reference environment temperature, and T represent the environment temperature.

Further, the measurement method comprises calculating a real power consumption value to the AC power according to Preal=P/ρreal. Preal represents the real power consumption value.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
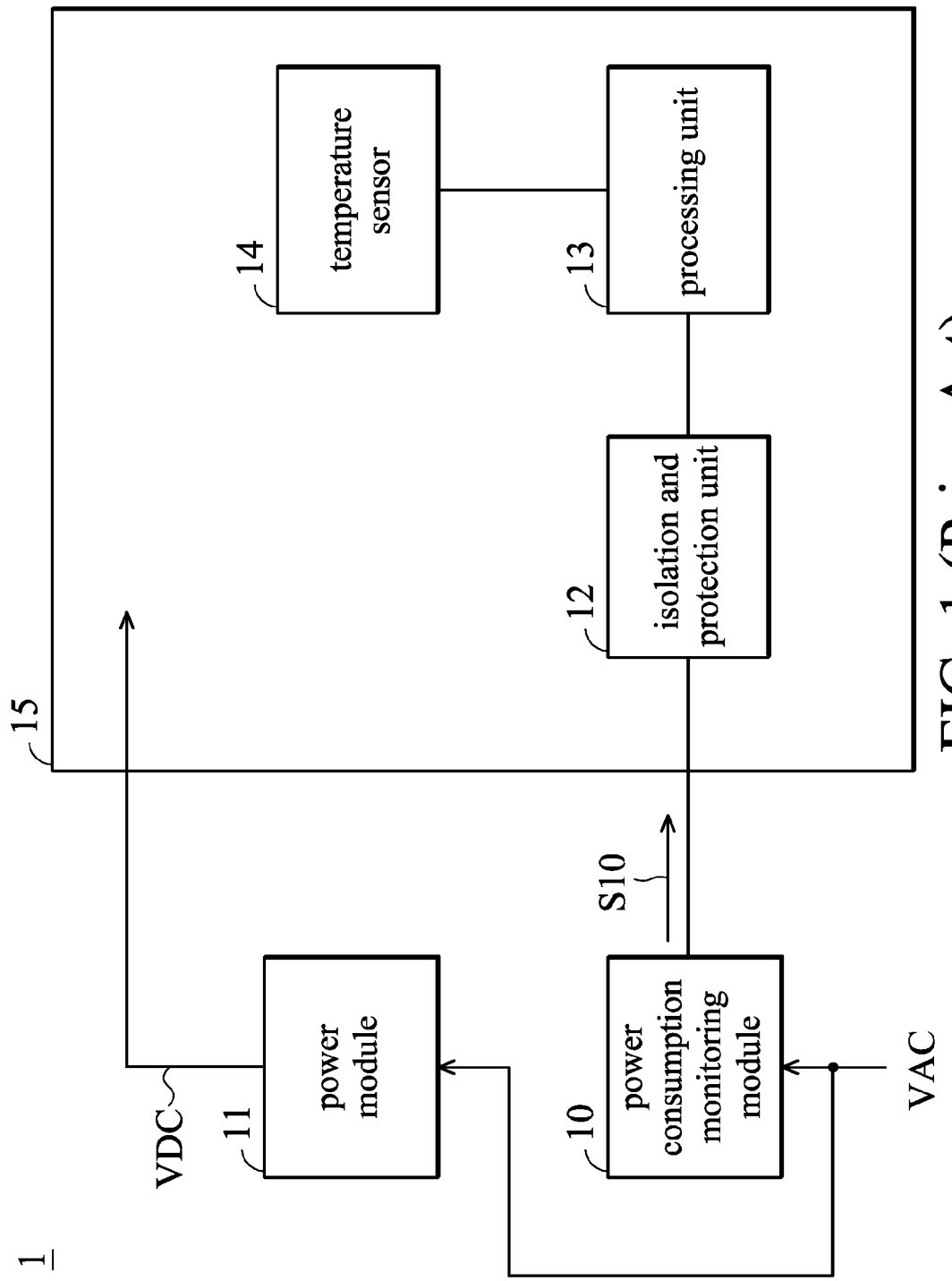
FIG. 1 shows a conventional electronic apparatus with power consumption measurement.
Figure 2:
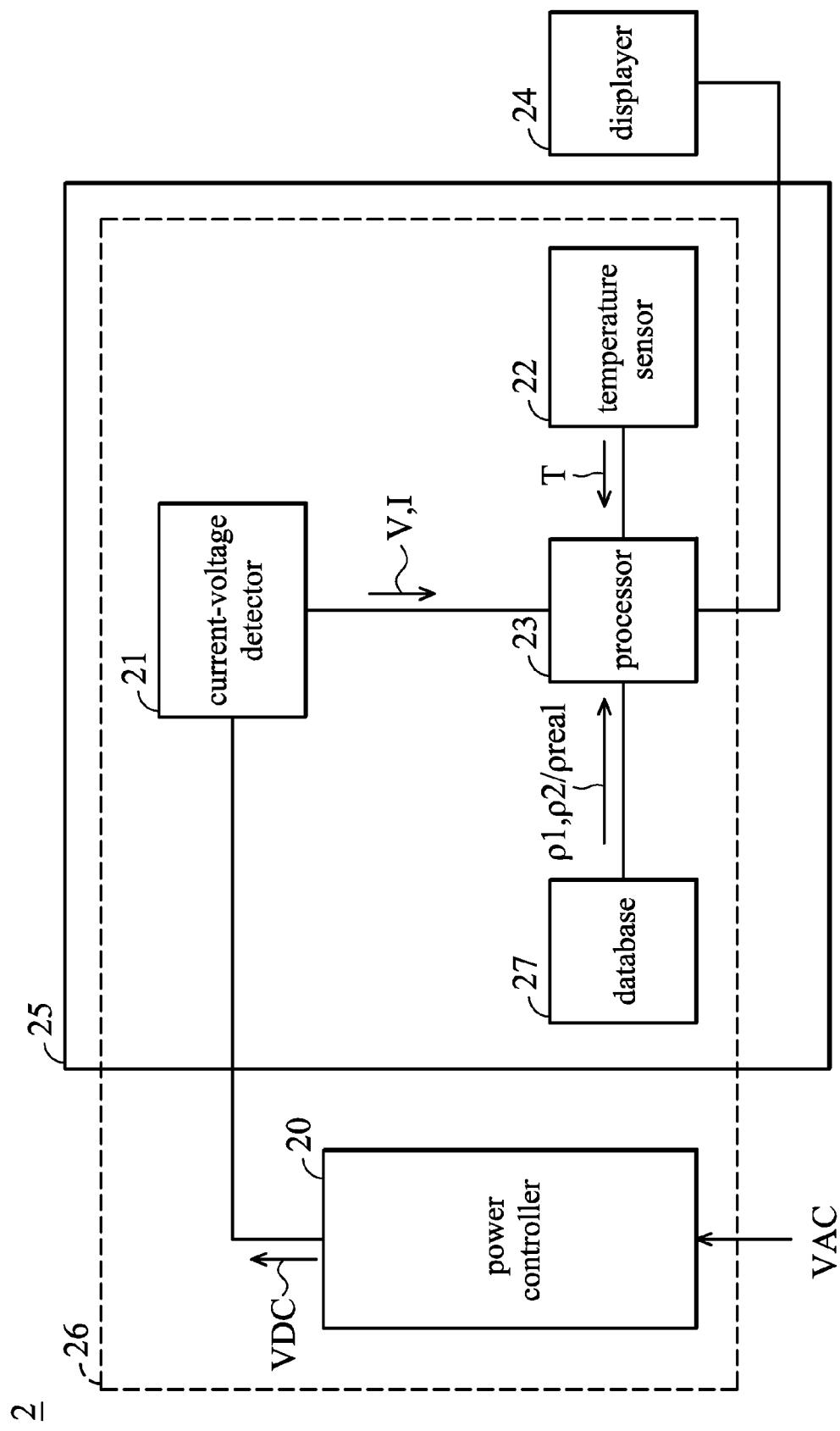
FIG. 2 shows an exemplary embodiment of an electronic apparatus with a power consumption measurement device of the present invention.

In an exemplary embodiment of an electronic apparatus in FIG. 2, an electronic apparatus 2 comprises a power controller 20, a current-voltage detector 21, a temperature sensor 22, a processor 23, and a displayer 24. A measurement device 26 is composed of the power controller 20, the current-voltage detector 21, the temperature sensor 22, and the processor 23. The current-voltage detector 21, the temperature sensor 22, and the processor 23 are arranged on a system circuit board 25. The power controller 20 receives an external alternating-current (AC) power VAC. The power controller 20 performs an AC-DC transformation operation and a buck conversion to the AC power VAC to generate direct-current (DC) power VDC. In the embodiment, the voltage of the AC power VAC is 120V, and the voltage of the DC power VDC is 12V. Thus, the current-voltage detector 21 is disposed on a low voltage side. The current-voltage detector 21 detects the DC power VDC to generate a corresponding voltage value V and a corresponding current value I. The temperature sensor 22 senses an environment temperature T of the measurement device 26. In the embodiment, the environment temperature T of the measurement device 26 is referred to an operating temperature of the electronic apparatus 2.

The processor 23 reads the voltage value V and the current value I from the current-voltage detector 21 and reads the environment temperature T from the temperature sensor 22. The processor 23 obtains an efficiency coefficient ρreal according to the voltage value V, the current value I, and the environment temperature T and obtains a real power consumption value Preal of the electronic apparatus 1 to the AC power VAC.

Figure 3:
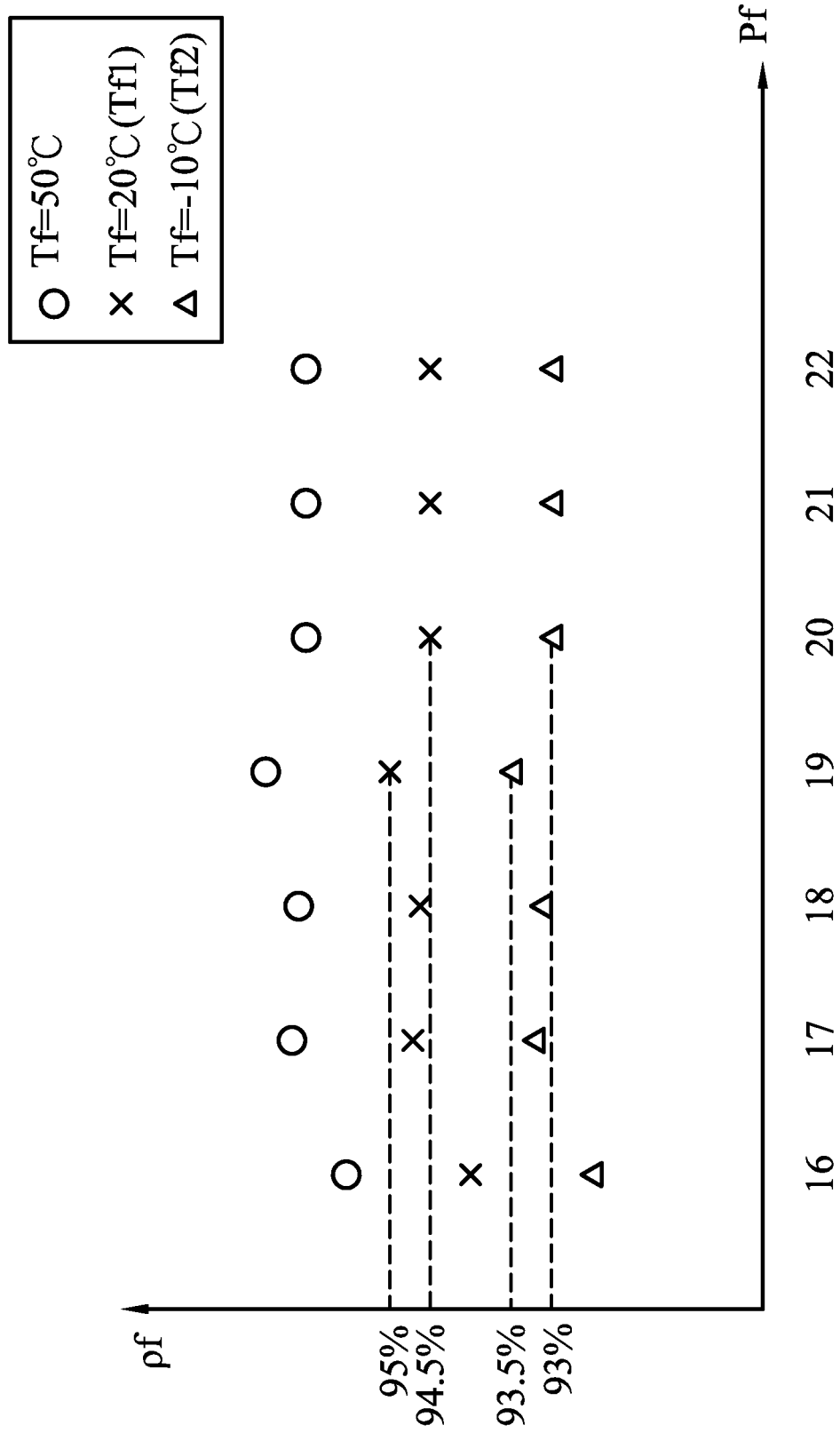
FIG. 3 shows the relationship between reference power consumption values, reference environment temperatures, and reference efficiency coefficients in a database of the electronic apparatus of FIG. 2.

In the embodiment, the electronic apparatus 1 comprises a database 27. The database 27 can be a memory device for storing data, such a non-volatile memory and a device for storing data. The database 27 stores a plurality of reference power consumption values Pf, a plurality of reference environment temperatures Tf, and a plurality of reference efficiency coefficients ρf. One reference power consumption value and one reference environment temperature collectively correspond to one reference efficiency coefficient. FIG. 3 shows the relationship between the reference power consumption values Pf, the reference environment temperatures Tf, and the reference efficiency coefficients ρf. In FIG. 3, seven reference power consumption values Pf (16 W, 17 W, 18 W, 19 W, 20 W, 21 W, and 22 W) and three reference environment temperatures Tf (−10° C., 20° C., and 50° C.) are given as examples. Each reference power consumption value Pf corresponds to three different reference efficiency coefficients ρf at three different reference environment temperatures Tf respectively.

In detail, the processor 23 calculates an estimated power consumption value P according to the voltage value V and the current value I by using Equation (1).

$$P = V \times I \tag{1}$$

Then, the processor 23 performs a search operation to the database 27 according to the estimated power consumption value P and the environment temperature T. During the search operation, the processor 23 determines that the estimated power consumption value P is between two reference power consumption values Pf1 and Pf2 and that the environment temperature T is between two reference environment temperatures Tf1 and Tf2. In the embodiment, the reference power consumption value Pf2 is larger than the reference power consumption value Pf1, and the reference environment temperature Tf1 is higher than the reference environment temperature Tf2. After obtaining the reference power consumption values Pf1 and Pf2 and the reference environment temperatures Tf1 and Tf2, the processor 23 performs the search operation to the database 27 to find one reference efficiency coefficient corresponding to the reference power consumption value Pf1 at the reference environment temperature Tf1 to serve as an estimated efficiency coefficient ρ1 and to find one reference efficiency coefficient corresponding to the reference power consumption value Pf2 at the reference environment temperature Tf1 to serve as an estimated efficiency coefficient ρ2.

After obtaining the estimated efficiency coefficients ρ1 and ρ2 at the reference environment temperature Tf1, the processor 23 calculates an intermediate value efficiency coefficient ρtf1 corresponding to the reference environment temperature Tf1 according to Equation (2).

$$\rho = \rho 1 + (\rho 2 - \rho 1) \times (P - Pf1) \tag{2}$$

Then, the processor 23 performs the search operation to the database 27 again to find one reference efficiency coefficient corresponding to the reference power consumption value Pf1 at the reference environment temperature Tf2 to serve as an estimated efficiency coefficient ρ1 and to find one reference efficiency coefficient corresponding to the reference power consumption value Pf2 at the reference environment temperature Tf2 to serve as an estimated efficiency coefficient ρ2.

After obtaining the estimated efficiency coefficients ρ1 and ρ2 at the reference environment temperature Tf2, the processor 23 calculates an intermediate value efficiency coefficient ρtf2 corresponding to the reference environment temperature Tf2 according to Equation (2).

After obtaining the intermediate value efficiency coefficients ρtf1 and ρtf2, the processor 23 obtains the efficiency coefficient ρreal according to Equation (3).

$$\rho real = (\rho tf1 + \rho tf2) \times (Tf1 - T)/(Tf1 - Tf2) \quad (3)$$

After this, the processor 23 calculates the real power consumption value Preal according to the estimated power consumption value P and the efficiency coefficient ρreal by using Equation (4).

$$Preal = P/\rho real \quad (4)$$

The following example is given for description. It is assumed that the estimated power consumption value P, which is calculated by the processor 23 according to the voltage value V and the current value I by using Equation (1), is equal to 19.5 W (P=19.5 W), and the environment temperature T which is sensed by the temperature sensor 22 is equal to 5° C. (T=5° C.). The processor 23 determines that the estimated power consumption value P is between the reference power consumption values 19 W (Pf1=19 W) and 20 W (Pf2=20 W) and that the environment temperature T is between the reference environment temperatures 20° C. (Tf1=20° C.) and −10° C. (Tf2=−10° C.). The processor 23 then performs the search operation to the database 27 to obtain the reference efficiency coefficient 95% corresponding to the reference power consumption value 19 W (Pf1) at the reference environment temperature 20° C. (Tf1) to serve as the estimated efficiency coefficient ρ1 (ρ1=95%) and obtain the reference efficiency coefficient 94.5% corresponding to the reference power consumption value 20 W (Pf2) at the reference environment temperature 20° C. (Tf1) to serve as the estimated efficiency coefficient ρ2 (ρ2=94.5%). Moreover, the processor 23 calculates the intermediate value efficiency coefficient ρtf1 as being equal to 0.9475 (ρtf1=0.9475), corresponding to the reference environment temperature 20° C. (Tf1) according to the estimated efficiency coefficients ρ1 and ρ2 at the reference environment temperature 20° C. (Tf1) by using Equation (2). The processor 23 also performs the search operation to the database 27 to obtain the reference efficiency coefficient 93.5% corresponding to the reference power consumption value 19 W (Pf1) at the reference environment temperature −10° C. (Tf2) to serve as the estimated efficiency coefficient ρ1 (ρ1=93.5%) and obtain the reference efficiency coefficient 93% corresponding to the reference power consumption value 20 W (Pf2) at the reference environment temperature −10° C. (Tf2) to serve as the estimated efficiency coefficient ρ2 (ρ2=93%). Moreover, the processor 23 calculates the intermediate value efficiency coefficient ρtf2 as being equal to 0.9325 (ρtf2=0.9325), corresponding to the reference environment temperature −10° C. (Tf2) according to the estimated efficiency coefficients ρ1 and ρ2 at the reference environment temperature −10° C. (Tf2) by using Equation (2). Moreover, the processor 23 calculates the efficiency coefficient ρreal being equal to 0.949 (ρreal=0.949) according to the intermediate value efficiency coefficients ρtf1 and ρtf2 by using Equation (2). Then, the processor 23 calculates the real power consumption value Preal being equal to 20.547 W (Preal=20.547 W) according to the estimated power consumption value P (P=19.5 W) and the efficiency coefficient ρreal (ρreal=0.949) by using Equation (4).

According to the above embodiment, the measurement device 26 can measure the real power consumption value Preal of the electronic apparatus 1. After the real power consumption value Preal is obtained, the real power consumption value Preal can be displayed on the displayer 24, which prompts users to perform power consumption management. Moreover, in the measurement device 26, both the current-voltage detector 21 and the processor 23 are disposed on the low-voltage side. Accordingly, the current-voltage detector 21, which is used to monitor power consumption, is not implemented by high voltage elements with a large size and high cost, and an isolation and protection unit is not required to be disposed between the current-voltage detector 21 and the processor 23, thereby reducing the size and manufacturing cost of the electronic apparatus 2.

In the above embodiment, the processor 23 performs the search operation to the database 27 to find the estimated efficiency coefficients ρ1 and ρ2 and then obtains the real power consumption value Preal according to Equation (2) to Equation (4). In another embodiment, the sample density of the database 27 may be small enough, that is the number of the reference power consumption values Pf, the number of reference environment temperatures Tf, and the number of reference efficiency coefficients ρf in the database 27 may be large enough. In this case, the processor 23 can perform the search operation to the database 27 according to the estimated power consumption value P and the environment temperature T to directly obtain the efficiency coefficient ρreal. Then, the processor 23 calculates the real power consumption value Preal according to the estimated power consumption value P and the efficiency coefficient ρreal by using Equation (4).

Figure 4A:
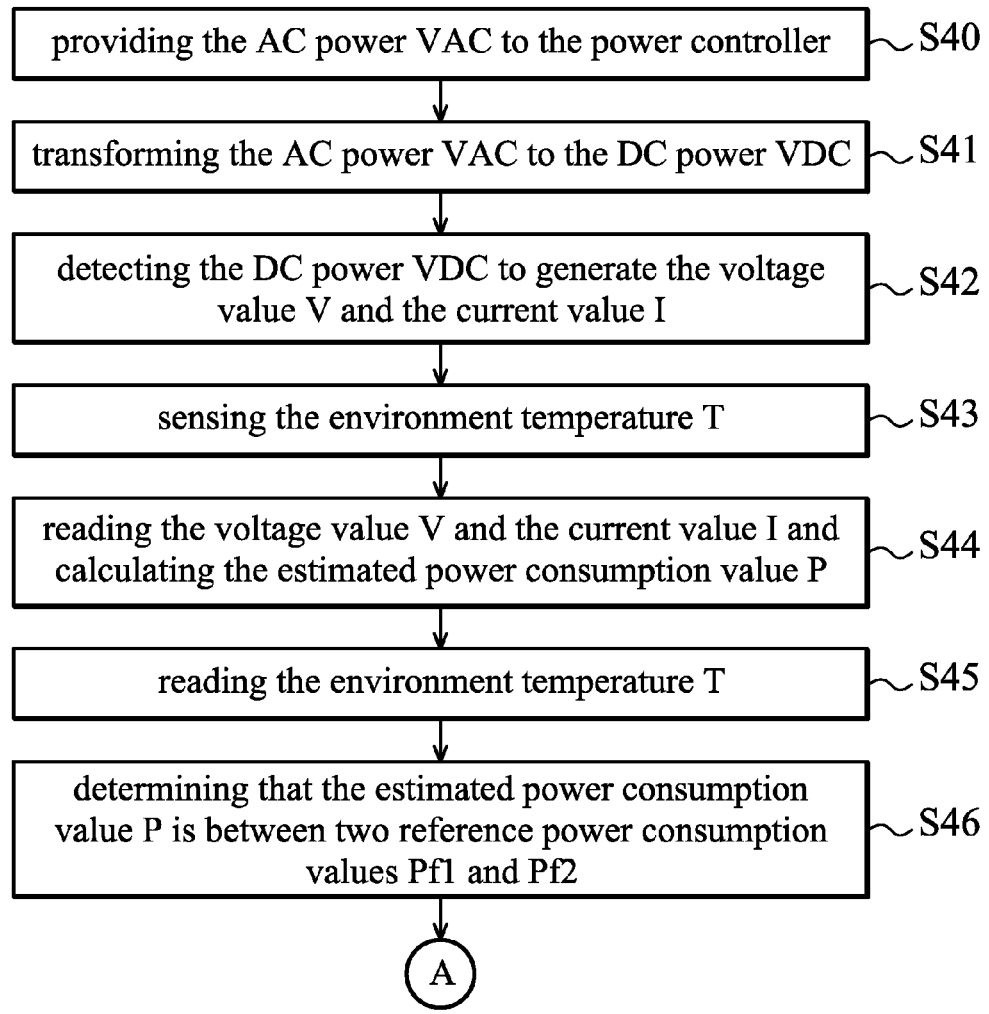
FIGS. 4 A and B show a flow chart of one exemplary embodiment of the measurement method.
Figure 4A:
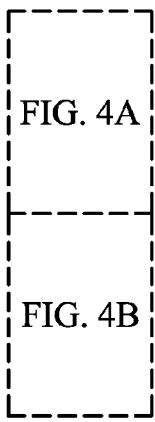
Figure 4B:
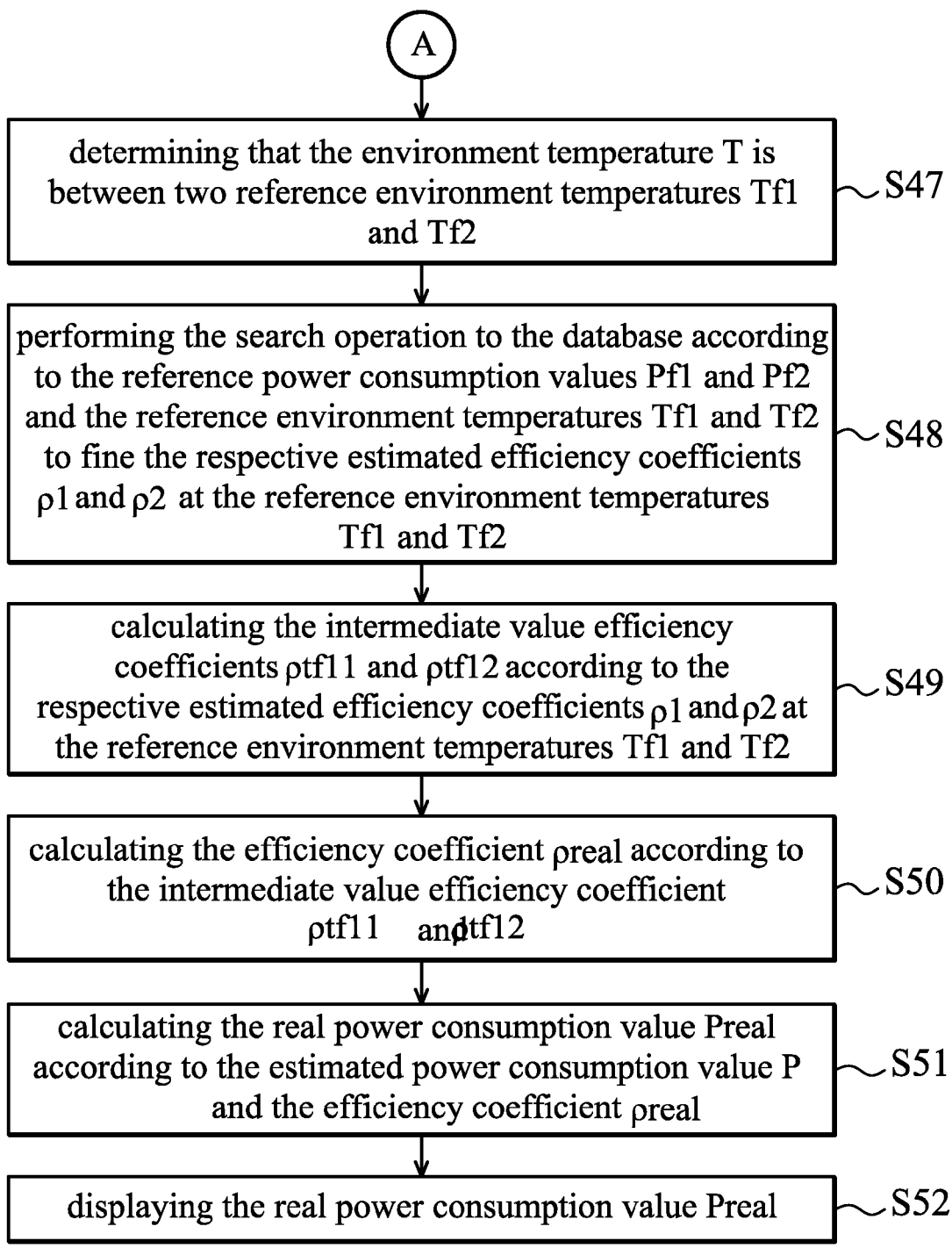
Figure 5:
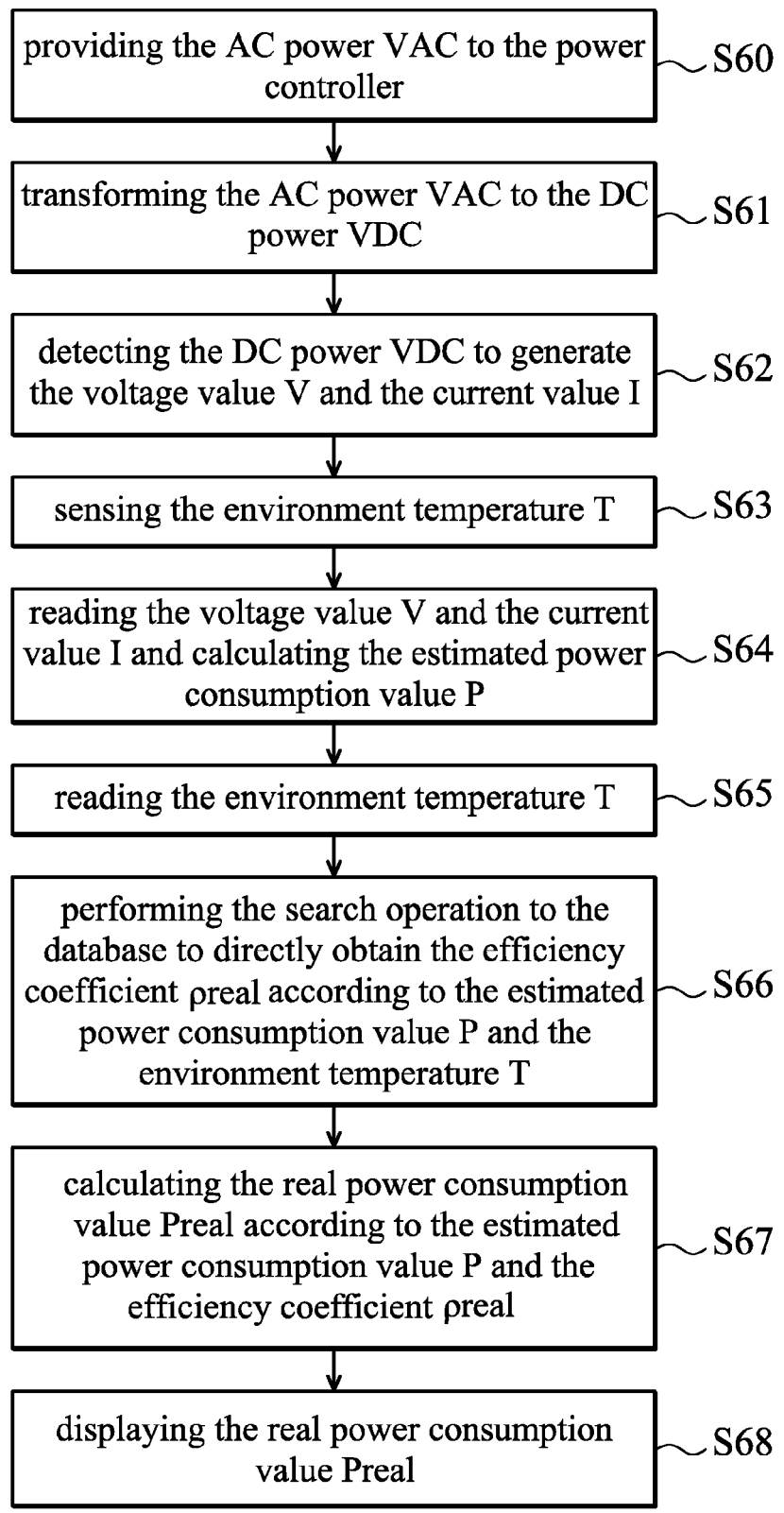
FIG. 5 shows a flow chart of another exemplary embodiment of the measurement method.

FIGS. 4A and 4B show a flow chart of one exemplary embodiment of a measurement method to measure power consumption of an electric apparatus. In the following, the measurement method will be described by referring to FIGS. 1-4B. The electronic apparatus 2 is powered by DC power which transformed from AC power. For example, the AC power VAC can be provided to the power controller 20 (step S40), and the power controller 20 performs the AC-DC transformation operation and the buck conversion to transform the AC power VAC to the DC power VDC (step S41) to power the electronic apparatus 2. The steps of measuring the real power consumption voltage of the electronic apparatus 2, which is powered by DC power, to AC power will be described in the following. As shown in FIG. 4A, the current-voltage detector 21 detects the DC power VDC to generate the voltage value V and the current value I (step S42). At this time, the temperature sensor 22 also senses the environment temperature T of the measurement device 26 (also the operating temperature of the electronic apparatus 2) (step S43). In the embodiment, the order of the steps S42 and S43 is an example. In other embodiments, the step S43 can be performed first, and then the step S42 is performed after the step S43.

When users desire to know the power consumption of the electronic apparatus 1, the processor 23 reads the voltage value V and the current value I from the current-voltage detector 21 and calculates the estimated power consumption value P according to Equation (1) (step S44). At this time, the processor 23 also reads the environment temperature T from the temperature sensor 22 (step S45). In the embodiment, the order of the steps S44 and S45 is an example. In other embodiments, the step S45 can be performed first, and then the step S44 is performed after the step S45.

After this, the processor 23 determines that the estimated power consumption value P is between two reference power consumption values Pf1 and Pf2 (step S46). The processor 23 determines that the environment temperature T is between two reference environment temperatures Tf1 and Tf2 (step S47). In the embodiment, the order of the steps S46 and S47 is an example. In other embodiments, the step S47 can be performed first, and then the step S46 is performed after the step S47.

After obtaining the reference power consumption values Pf1 and Pf2 and the reference environment temperatures Tf1 and Tf2, a step S48 is performed. In the step S48, the processor 23 performs the search operation to the database 27 to find one reference efficiency coefficient corresponding to the reference power consumption value Pf1 at the reference environment temperature Tf1 to serve as an estimated efficiency coefficient ρ1, and also to find one reference efficiency coefficient corresponding to the reference power consumption value Pf2 at the reference environment temperature Tf1 to serve as an estimated efficiency coefficient ρ2. Moreover, in the step S48, the processor 23 also performs the search operation to the database 27 again to find one reference efficiency coefficient corresponding to the reference power consumption value Pf1 at the reference environment temperature Tf2 to serve as an estimated efficiency coefficient ρ1 and to find one reference efficiency coefficient corresponding to the reference power consumption value Pf2 at the reference environment temperature Tf2 to serve as an estimated efficiency coefficient ρ2.

Then, the processor 23 calculates the intermediate value efficiency coefficient ρtf1 corresponding to the reference environment temperature Tf1 and the intermediate value efficiency coefficient ρtf2 corresponding to the reference environment temperature Tf2 according to the respective estimated efficiency coefficients ρ1 and ρ2 at the reference environment temperatures Tf1 and Tf2 by using Equation (2) (step S49).

After this, the processor 23 calculates the efficiency coefficient ρreal according to the intermediate value efficiency coefficient ρtf1 and ρtf2 by using Equation (3) (step S50). Moreover, the processor 23 calculates the real power consumption value Preal according to the estimated power consumption value P and the efficiency coefficient ρreal by using Equation (4) (step S51). After obtaining the real power consumption value Preal, the real power consumption value Preal can be displayed on the displayer 24 (step S52) to prompt users to perform power consumption management.

Another exemplary embodiment of a measurement method is applied when the amount of data stored in the database 27 is large enough. The efficiency coefficient ρreal can be directly obtained by the search operation to the database 27, and the real power consumption value Preal can be calculated rapidly. Referring to FIG. 6, the step S60-S65 of the embodiment is the same as the steps S40-S45 of FIG. 4A, thus omitting the related description. After obtaining the estimated power consumption value P and reading the environment temperature T, the processor 23 performs the search operation to the database 27 to directly obtain the efficiency coefficient ρreal (step S66). Then, the processor 23 calculates the real power consumption value Preal according to the estimated power consumption value P and the efficiency coefficient ρreal by using Equation (4) (step S67). After obtaining the real power consumption value Preal, the real power consumption value Preal can be displayed on the displayer 24 (step S68) to prompt users to perform power consumption management.

According to the above embodiment, the measurement method is performed to obtain the power consumption value P to the DC power VDC by measuring the voltage value T and the current value I of the DC power VDC and considering the effect of the environment temperature T. After this, the processor 23 calculates the efficiency coefficient ρreal of the power controller 20 and calculates the power consumption value Preal to the AC power VAC. Accordingly, the power consumption value Preal to the AC power VAC can be accurately measured by the measurement device 26 with a small size and low cost.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A measurement device comprising:
   a power controller for receiving alternating-current (AC) power and transforming the AC power to direct-current (DC) power;
   a detector for detecting DC power to generate a voltage value and a current value;
   a temperature sensor for sensing an environment temperature of the measurement device; and
   a processor for reading the voltage value, the current value, and the environment temperature, obtaining an efficiency coefficient of the power controller according to the voltage value, the current value, and the environment temperature, and obtaining a real power consumption value corresponding to the AC power according to the efficiency coefficient.

2. The measurement device as claimed in claim 1 further comprising:
   a database, wherein the processor calculates an estimated power consumption value according to the voltage value and the current value and performs a search operation to the database according to the estimated power consumption value and the environment temperature to obtain the efficiency coefficient; and
   wherein the processor calculates the real power consumption value according to the efficiency coefficient and the estimated power consumption value.

3. The measurement device as claimed in claim 2, wherein the processor calculates the real power consumption value according to Preal=P/ρreal;
   wherein Preal represents the real power consumption value, P represents the estimated power consumption value, and ρreal represents the efficiency coefficient.

4. The measurement device as claimed in claim 1 further comprising:
   a database for storing a plurality of reference power consumption values, a plurality of reference environment temperatures, and a plurality of reference efficiency coefficients, wherein one of the reference power consumption values and one of the reference environment temperatures collectively correspond to one of the reference efficiency coefficients;
   wherein the processor calculates an estimated power consumption value according to the voltage value and the current value;

wherein the processor determines that the estimated power consumption value is between a first reference power consumption value and a second reference power consumption value, and the second reference power consumption value is larger than the first reference power consumption value;

wherein the processor determines that the environment temperature is between a first reference environment temperature and a second reference environment temperature, and the first reference environment temperature is higher than the second reference environment temperature;

wherein the processor performs a search operation to the database to find the reference efficiency coefficient corresponding to the first reference power consumption value and the first reference environment temperature to serve as a first estimated efficiency coefficient and find the reference efficiency coefficient corresponding to the second reference power consumption value and the first reference environment temperature to serve as a second estimated efficiency coefficient;

wherein the processor performs the search operation to the database to find the reference efficiency coefficient corresponding to the first reference power consumption value and the second reference environment temperature to serve as a third estimated efficiency coefficient and find the reference efficiency coefficient corresponding to the second reference power consumption value and the second reference environment temperature to serve as a fourth estimated efficiency coefficient;

wherein the processor calculates a first intermediate value efficiency and a second intermediate value efficiency according to $\rho=\rho1+(\rho2-\rho1)\times(P-Pf1)$, where P represents the estimated power consumption value, and Pf1 represents first reference power consumption value;

wherein $\rho1$ represents the first estimated efficiency coefficient and $\rho2$ represents the second estimated efficiency coefficient when the processor calculates the first intermediate value, and $\rho1$ represents the third estimated efficiency coefficient and $\rho2$ represents the fourth estimated efficiency coefficient when the processor calculates the second intermediate value efficiency;

wherein the processor calculates the efficiency coefficient according to $\rho real=(\rho tf1+\rho tf2)\times(Tf1-T)/(Tf1-Tf2)$, where $\rho real$ represents the efficiency coefficient, $\rho tf1$ represents the first intermediate value efficiency, $\rho tf2$ represents the second intermediate value efficiency, Tf1 represents the first reference environment temperature, Tf2 represents the second reference environment temperature, and T represent the environment temperature; and wherein the processor calculates the real power consumption value according to $Preal=P/\rho real$, and Preal represents the real power consumption value.

5. A measurement method for measuring a power consumption value of an electronic apparatus, wherein the electronic apparatus is powered by direct-current (DC) power transformed from alternating-current (AC) power, and the measurement method comprises:

detecting the DC power to generate a voltage value and a current value;

sensing an environment temperature;

obtaining an efficiency coefficient according to the voltage value, the current value, and the environment temperature; and obtaining a real power consumption value to the AC power according to the efficiency coefficient.

6. The measurement method as claimed in claim 5, wherein the step of obtaining the efficiency coefficient comprises:

calculating an estimated power consumption value according to the voltage value and the current value; and performing a search operation to a database according to the estimated power consumption value and the environment temperature to obtain the efficiency coefficient; and wherein the step of obtaining the real power consumption value to the AC power according to the efficiency coefficient comprises:

calculating the real power consumption value according to the efficiency coefficient and the estimated power consumption value.

7. The measurement method as claimed in claim 6, wherein in the step calculating the real power consumption value according to the efficiency coefficient and the estimated power consumption value, the real power consumption value is calculated according to $Preal=P/\rho real$;

wherein Preal represents the real power consumption value, P represents the estimated power consumption value, and $\rho real$ represents the efficiency coefficient.

8. The measurement method as claimed in claim 5, wherein the step of obtaining the efficiency coefficient comprises:

calculating an estimated power consumption value according to the voltage value and the current value;

performing a search operation to a database according to the estimated power consumption value and the environment temperature to obtain a first estimated efficiency coefficient, a second estimated efficiency coefficient, a third estimated efficiency coefficient, and a fourth estimated efficiency coefficient; and calculating the efficiency coefficient according to the first, second, third, and fourth estimated efficiency coefficients; and wherein the step of obtaining the real power consumption value to the AC power according to the efficiency coefficient comprises:

calculating the real power consumption value according to the efficiency coefficient and the estimated power consumption value.

9. The measurement method as claimed in claim 8, wherein the database stores a plurality of reference power consumption values, a plurality of reference environment temperatures, and a plurality of reference efficiency coefficients, and one of the reference power consumption values and one of the reference environment temperatures collectively correspond to one of the reference efficiency coefficients;

wherein the step of performing the search operation to the database according to the estimated power consumption value and the environment temperature to obtain the first, second, third, and fourth estimated efficiency coefficients comprises:

determining that the estimated power consumption value is between a first reference power consumption value and a second reference power consumption value among the plurality of reference power consumption values, wherein the second reference power consumption value is larger than the first reference power consumption value;

determining that the environment temperature is between a first reference environment temperature and a second reference environment temperature among the plurality of reference environment temperatures, wherein the first reference environment temperature is higher than the second reference environment temperature;

performing the search operation to the database to find the reference efficiency coefficient corresponding to the first reference power consumption value and the first reference environment temperature to serve as the first estimated efficiency coefficient and find the reference efficiency coefficient corresponding to the second reference power consumption value and the first reference environment temperature to serve as the second estimated efficiency coefficient; and performing the search operation to the database to find the reference efficiency coefficient corresponding to the first reference power consumption value and the second reference environment temperature to serve as the third estimated efficiency coefficient and find the reference efficiency coefficient corresponding to the second reference power consumption value and the second reference environment temperature to serve as the fourth estimated efficiency coefficient.

10. The measurement method as claimed in claim 9, wherein the step of calculating the efficiency coefficient according to the first, second, third, and fourth estimated efficiency coefficients comprises:

calculating a first intermediate value efficiency and a second intermediate value efficiency according to $\rho=\rho1+(\rho2-\rho1)\times(P-Pf1)$, wherein P represents the estimated power consumption value, Pf1 represents first reference power consumption value, $\rho1$ represents the first estimated efficiency coefficient and $\rho2$ represents the second estimated efficiency coefficient when the processor calculates the first intermediate value, and $\rho1$ represents the third estimated efficiency coefficient and $\rho2$ represents the fourth estimated efficiency coefficient when the processor calculates the second intermediate value efficiency; and calculating the efficiency coefficient according to $\rho real=(\rho tf1+\rho tf2)\times(Tf1-T)/(Tf1-Tf2)$, wherein $\rho real$ represents the efficiency coefficient, $\rho tf1$ represents the first intermediate value efficiency, $\rho tf2$ represents the second intermediate value efficiency, Tf1 represents the first reference environment temperature, Tf2 represents the second reference environment temperature, and T represents the environment temperature; and wherein the step of calculating the real power consumption value according to the efficiency coefficient and the estimated power consumption value comprises:

calculating the real power consumption value according to $Preal=P/\rho real$, wherein Preal represents the real power consumption value.

11. A measurement method comprising:
providing alternating-current (AC) power;
transforming the AC power to direct-current (DC) power;
detecting the DC power to generate a voltage value and a current value;
sensing an environment temperature;
calculating an estimated power consumption value according to the voltage value and the current value;
performing a search operation to a database according to the estimated power consumption value and the environment temperature, wherein the database stores a plurality of reference power consumption values, a plurality of reference environment temperatures, and a plurality of reference efficiency coefficients, and one of the reference power consumption values and one of the reference environment temperatures collectively correspond to one of the reference efficiency coefficients;

determining that the estimated power consumption value is between a first reference power consumption value and a second reference power consumption value among the plurality of reference power consumption values according to the search operation to the database, wherein the second reference power consumption value is larger than the first reference power consumption value;

determining that the environment temperature is between a first reference environment temperature and a second reference environment temperature among the plurality of reference environment temperatures according to the search operation to the database, wherein the first reference environment temperature is higher than the second reference environment temperature;

performing the search operation to the database to find the reference efficiency coefficient corresponding to the first reference power consumption value and the first reference environment temperature to serve as a first estimated efficiency coefficient and find the reference efficiency coefficient corresponding to the second reference power consumption value and the first reference environment temperature to serve as a second estimated efficiency coefficient;

performing the search operation to the database to find the reference efficiency coefficient corresponding to the first reference power consumption value and the second reference environment temperature to serve as a third estimated efficiency coefficient and find the reference efficiency coefficient corresponding to the second reference power consumption value and the second reference environment temperature to serve as a fourth estimated efficiency coefficient;

calculating a first intermediate value efficiency and a second intermediate value efficiency according to $\rho=\rho1+(\rho2-\rho1)\times(P-Pf1)$, wherein P represents the estimated power consumption value, Pf1 represents the first reference power consumption value, $\rho1$ represents the first estimated efficiency coefficient and $\rho2$ represents the second estimated efficiency coefficient when the processor calculates the first intermediate value, and $\rho1$ represents the third estimated efficiency coefficient and $\rho2$ represents the fourth estimated efficiency coefficient when the processor calculates the second intermediate value efficiency;

calculating an efficiency coefficient according to $\rho real=(\rho tf1+\rho tf2)\times(Tf1-T)/(Tf1-Tf2)$, wherein $\rho real$ represents the efficiency coefficient, $\rho tf1$ represents the first intermediate value efficiency, $\rho tf2$ represents the second intermediate value efficiency, Tf1 represents the first reference environment temperature, Tf2 represents the second reference environment temperature, and T represent the environment temperature; and calculating a real power consumption value to the AC power according to $Preal=P/\rho real$, wherein Preal represents the real power consumption value.

* * * * *